(12) United States Patent
Latour et al.

(10) Patent No.: US 11,478,967 B2
(45) Date of Patent: Oct. 25, 2022

(54) METHOD FOR MANUFACTURING A PLASTIC PART FORMING A HUMAN-MACHINE CONTROL INTERFACE

(71) Applicants: COMMISSARIAT A L'ENERGIE ATOMIQUE ET AUX ENERGIES ALTERNATIVES, Paris (FR); SYMBIOSE, Arveyres (FR)

(72) Inventors: Antoine Latour, Seyssinet-Pariset (FR); Antoine Gras, Val-de-Virvee (FR); Sebastien Pawlak, Saint Genest Malifaux (FR)

(73) Assignees: COMMISSARIAT A L'ENERGIE ATOMIQUE ET AUX ENERGIES ALTERNATIVES, Paris (FR); SYMBIOSE, Arveyres (FR)

( * ) Notice: Subject to any disclaimer, the term of this patent is extended or adjusted under 35 U.S.C. 154(b) by 347 days.

(21) Appl. No.: 16/530,601

(22) Filed: Aug. 2, 2019

(65) Prior Publication Data
US 2020/0039129 A1 Feb. 6, 2020

(30) Foreign Application Priority Data
Aug. 2, 2018 (FR) ...................................... 18 57255

(51) Int. Cl.
*B29C 45/14* (2006.01)
*H05K 3/00* (2006.01)
(Continued)

(52) U.S. Cl.
CPC .... *B29C 45/14811* (2013.01); *B29C 45/1671* (2013.01); *H03K 17/9622* (2013.01); *H05K 3/0014* (2013.01)

(58) Field of Classification Search
CPC ......... B29C 45/14639; B29C 45/14811; B29C 45/1671; B29C 45/1418; H05K 3/0011;
(Continued)

(56) References Cited

U.S. PATENT DOCUMENTS 5,979,043 A * 11/1999 Baker ............... B29C 45/14467
156/245
6,197,145 B1 * 3/2001 Todd ................. B29C 45/14811
29/841
(Continued)

FOREIGN PATENT DOCUMENTS

DE        298 24 038 U1   4/2000
WO    WO 2013/058708 A1  4/2013
WO    WO 2016/024066 A1  2/2016

OTHER PUBLICATIONS

French Preliminary Search Report dated May 17, 2019 in French Application 18 57255 filed on Aug. 2, 2018 (with English Translation of Categories of Cited Documents).

*Primary Examiner* — Jeffrey T Carley
(74) *Attorney, Agent, or Firm* — Oblon, McClelland, Maier & Neustadt, L.L.P.

(57) ABSTRACT

A method for manufacturing a plastic part forming a human-machine control interface includes formation of a decorative film, formation of a technical film including a layer of haptic actuators and a layer of capacitive sensors, assembly to form an interface film, positioning in an injection mould, including an upper portion and a lower portion including a moveable support pad capable of coming into contact with the interface film such that a thickness is left free between the interface film and the lower portion of the injection mould outside of the support pad, injection of a plastic material into the free thickness on either side of the support pad, and opening of the injection mould and ejection of the plastic part formed.

15 Claims, 3 Drawing Sheets

(51) Int. Cl.
*H03K 17/96* (2006.01)
*B29C 45/16* (2006.01)

(58) Field of Classification Search
CPC ........ H05K 3/007; H05K 3/0014; H05K 3/10; H03K 17/9622
See application file for complete search history.

(56) References Cited

U.S. PATENT DOCUMENTS

| | | | | |
|---|---|---|---|---|
| 6,428,650 | B1 * | 8/2002 | Chung | H01L 21/4803 156/250 |
| 7,254,008 | B2 * | 8/2007 | Xie | G01L 9/0042 361/283.4 |
| 8,198,979 | B2 * | 6/2012 | Haag | B29C 45/14639 174/257 |
| 8,238,073 | B2 * | 8/2012 | Tong | H03K 17/9622 361/278 |
| 8,263,211 | B2 * | 9/2012 | Nishimura | B29C 45/14639 428/194 |
| 8,294,055 | B2 * | 10/2012 | Kim | B29C 45/14811 200/600 |
| 8,674,941 | B2 * | 3/2014 | Casparian | H01H 13/702 345/168 |
| 8,912,447 | B2 * | 12/2014 | Leong | H03K 17/9622 174/254 |
| 9,112,505 | B2 | 8/2015 | Wippler | |
| 2005/0127565 | A1 * | 6/2005 | Wilson | B29C 45/1418 264/275 |
| 2007/0229455 | A1 | 10/2007 | Martin et al. | |
| 2012/0314380 | A1 * | 12/2012 | Moncrieff | H05K 3/30 361/748 |
| 2014/0131188 | A1 * | 5/2014 | Isoda | H03K 17/962 200/600 |
| 2015/0016144 | A1 * | 1/2015 | Keist | B29C 45/0053 362/611 |

\* cited by examiner

METHOD FOR MANUFACTURING A PLASTIC PART FORMING A HUMAN-MACHINE CONTROL INTERFACE

TECHNICAL FIELD

The present invention pertains to the general field of human-machine interfaces, and more specifically human-machine interfaces that are integrated in plastic parts.

Generally speaking, the invention finds applications in any field of industry for which plastic surfaces require a human-machine interface. In particular, the invention may be applied to any interface for which mechanical push buttons are replaced by touch surfaces, for example for a central console of a vehicle. In this case, the integration of buttons generating a vibration when touched by the user transforms the plastic part constituting the central console into an "intelligent" object making it possible to interact with the driver or the passenger. The invention also finds applications for household electrical appliances for which the entirely smooth control panels require the addition of a control validation.

More specifically, the invention relates to a method for manufacturing a plastic part forming a human-machine control interface using a specific injection mould.

PRIOR ART

In a large number of electronic devices, such as household electrical appliances, automobile dashboards, etc., a plastic facade contains buttons enabling the user to interact with the electronic device. For example, in the case of an automobile dashboard, it is possible to position buttons to start the air conditioning, to lock the doors or instead to actuate the raising or lowering of a window, among other things.

Historically, these buttons were mechanical push buttons. These mechanical push buttons required assembly steps and were not perfectly integrated in the plastic facades. In particular, a slight amount of daylight always remained around the buttons. For this reason, more and more designers now prefer to integrate capacitive buttons, such as for example described in the U.S. Pat. No. 9,112,505 B2.

The use of capacitive sensors to replace mechanical push buttons makes it possible to have a completely smooth surface of the facade, which is thus more aesthetic, and also easier to clean and more robust, thanks to the absence of moving parts. In addition, users are today very familiar with capacitive interfaces thanks to the generalised use of touch screens in smartphones or tablets.

These capacitive sensors are particularly well suited to being integrated in facades decorated by a plastic injection technology such as the so-called IMF (In Mould Forming) technology. The principle of this technology is to print a decorative layer on a plastic sheet. This sheet is next cut, thermoformed if necessary, then over-moulded, to obtain a decorated plastic part.

However, a major drawback of these capacitive buttons is that the user does not have at his disposal tactile feedback when the button is actuated. A frequently employed solution to circumvent this difficulty is to generate a sound, for example a click, or a luminous signal, when the user actuates the capacitive button to confirm to him that the instruction has been taken into account by the electronic equipment. However, in noisy environments for example or in cases where the user is looking elsewhere, for example for an automobile driver who actuates a button while driving, these two solutions are not suitable.

Also, other solutions exist to ensure feedback to the user, for example by the triggering of a vibration that his finger is going to perceive, such as for example described in the patent application US 2007/229455 A1.

The actuators conventionally used to achieve haptic feedback, such as voice coil actuators, piezoelectric actuators, eccentric mass actuators and/or moving magnet actuators, have a bulk which, most of the time, do not make it possible to associate them individually with each button. Thus, as described in the patent application US 2007/229455 A1, for a keyboard comprising several keys, this results in an actuator that is going to make the whole of the keyboard vibrate.

This principle is well suited in the case of quite rigid, small sized electronic devices, such as smartphones. On the other hand, it comprises limits: firstly, when the facade is composed of a material that considerably dampens vibrations, it will be necessary to generate a lot of vibrations so that they are not too dampened and remain perceptible for the user; in addition, when the facade is completely embedded, vibrating it will be complicated; next, in the case of multi-key use, it would be preferable to carry out a localised vibration rather than a vibration of the whole of the part.

Faced with these constraints, piezoelectric actuators formed in thin films may be used such as described for example in the international application WO 2016/024066 A1. The interest of these actuators is that they are very thin and that they can thus be integrated directly in the facade. It may notably be thought to print them directly on the decorative film, and to over-mould them. However, if this is done, the actuators are completely embedded in the plastic part, and no vibration is perceived when they are supplied.

DESCRIPTION OF THE INVENTION

The aim of the invention is thus to resolve at least partially the aforementioned needs and drawbacks relating to embodiments of the prior art.

The subject matter of the invention is thus, according to one of its aspects, a method for manufacturing a plastic part forming a human-machine control interface, characterised in that it comprises the following steps:

formation of a decorative film intended to form the visible interface, formation of a technical film, or haptic film, including a layer of haptic actuators, and a layer of capacitive sensors, assembly of the decorative film and the technical film to form an interface film, positioning of the interface film in an injection mould, including an upper portion, also called counter mould, with which the interface film is maintained in contact by suction and a lower portion, also called matrix, including a moveable support pad, if needs be several moveable support pads, capable of coming into contact with the interface film at the level of the layer of haptic actuators such that a thickness is left free between the interface film and the lower portion of the injection mould outside of the support pad, injection of a plastic material into the free thickness on either side of the support pad, opening of the injection mould and ejection of the plastic part formed.

The manufacturing method according to the invention may further comprise one or more of the following characteristics taken alone or according to all technically possible combinations thereof.

The decorative film may have a thickness comprised between 100 µm and 2 mm, preferentially between 250 µm and 1 mm.

The method may comprise a step of thermoforming the decorative film.

Furthermore, the decorative film and the technical film may be assembled together by means of an adhesive layer.

The support pad may be configured to form a free zone, without plastic material in the plastic part, of circular shape and having a diameter comprised between 5 and 40 mm.

Moreover, the support pad may be mounted on an elastic return member, notably a spring, within the lower portion of the injection mould.

The injection mould may be made of tempered steel.

Furthermore, before the step of injection of the plastic material, the method comprises the step of positioning an anti-deformation part, notably an annular part, in contact with the interface film in superposition with the support pad, said anti-deformation part being intended to be situated in the free zone of the plastic part formed by the support pad.

The support pad may comprise a machining to receive at least partially said anti-deformation part.

In addition, at the end of the step of ejection of the plastic part, the method comprises the step consisting in filling the free zone, without plastic material and formed by the support pad, with a flexible material, notably a rubbery material, having a Young's modulus less than 1 GPa, notably less than 100 MPa.

Moreover, at the end of the step of ejection of the plastic part, the method may comprise the step consisting in inserting into the free zone, without plastic material and formed by the support pad, a mechanically robust wall at a distance from the interface film. The distance separating the interface film and the mechanically robust wall may be comprised between 0.3 and 1 mm.

Furthermore, the haptic actuators of the layer of haptic actuators may be configured to operate as haptic sensors such that the interface formed by the decorative film comprises one or more pressure sensitive buttons.

The method may further comprise the cutting of the layer of haptic actuators and an optional adhesive layer between the layer of haptic actuators and the layer of capacitive sensors.

In addition, the method may comprise the step consisting in inserting a zero insertion force (ZIF) type sensor, at the level of the cutting of the layer of haptic actuators.

BRIEF DESCRIPTION OF THE DRAWINGS

The invention will be better understood on reading the detailed description that follows, of non-limiting exemplary embodiments thereof, and by examining the figures, schematic and partial, of the appended drawing, in which.

In all of these figures, identical references may designate identical or analogous elements.

In addition, the different parts represented in the figures are not necessarily represented according to a uniform scale, in order to make the figures more legible.

DETAILED DESCRIPTION OF PARTICULAR EMBODIMENTS

With reference to FIGS. 1 to 9, exemplary embodiments of plastic parts 1 obtained by manufacturing methods in accordance with the invention will now be described.

In order to respond to the problems raised by the solutions of the prior art, the invention advantageously makes it possible to modify the method for obtaining the plastic part 1 during over-moulding.

Figure 1:
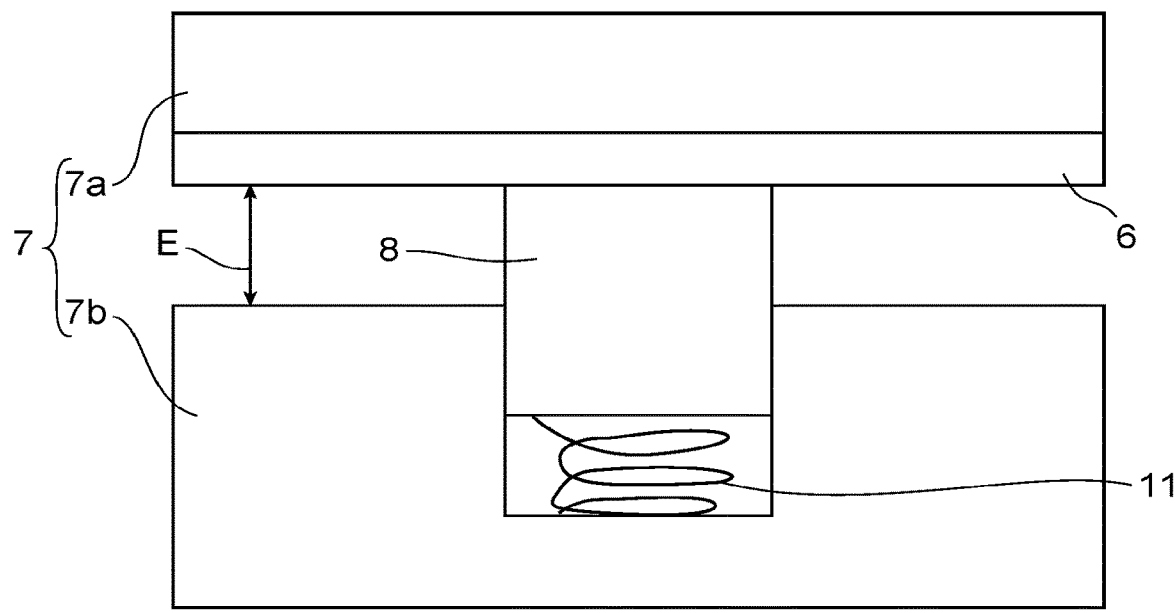
FIG. 1 illustrates partially an exemplary embodiment of a method for manufacturing a plastic part forming a human-machine control interface in accordance with the invention.
Figure 2:
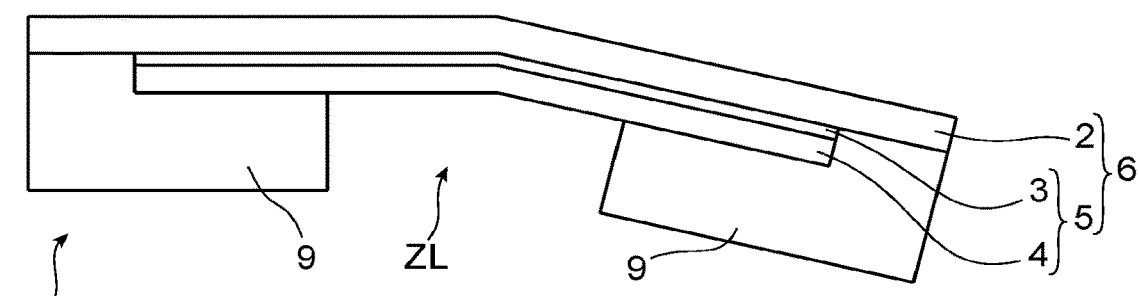
FIG. 2 illustrates, partially in section, an example of plastic part obtained by the method illustrated in FIG. 1.

As may be seen in FIG. 1 and in FIG. 2, the method according to the invention consists in forming an interface film 6, including a decorative film 2 and a layer of haptic actuators 5, which is next placed in an injection mould 7 provided with a support pad 8 intended to form a free zone ZL in the plastic material 9 of the plastic part 1 at the level of the haptic actuators.

Thus, the method firstly consists in forming the decorative film 2 which will serve as visible interface for a user and on which could be formed actuating buttons.

This decorative film 2 may be made of polycarbonate, and may be obtained by screen printing. The decorative film has a thickness comprised between 100 µm and 2 mm, notably between 250 µm and 1 mm, for example equal to 380 µm, so as to enable the vibration of the haptic actuators while conserving a certain rigidity of the plastic part 1 at the level of the free zone ZL formed by the support pad 8. Optionally, this decorative film 2 may be thermoformed.

The decorative film 2 may also be cut to constitute an insert that will be placed in the injection mould 7.

Furthermore, the method includes the formation of a technical film 5 including a layer of haptic actuators 3 and a layer of capacitive sensors 4. To do so, haptic, or piezo-electric, actuators and capacitive sensors, or electrodes, may be printed on a film, for example made of polyester or polycarbonate, for example of thickness of the order of 125 µm. In this way, the technical film 5 is obtained.

This technical film 5 may be deposited directly on the decorative film 2. In the case where the decorative film 2 must be thermoformed, it may be advantageous to deposit the technical film 5 on the decorative film 2 before the thermoforming step, when the decorative film 2 is still flat, and to next carry out the thermoforming.

Figure 8:
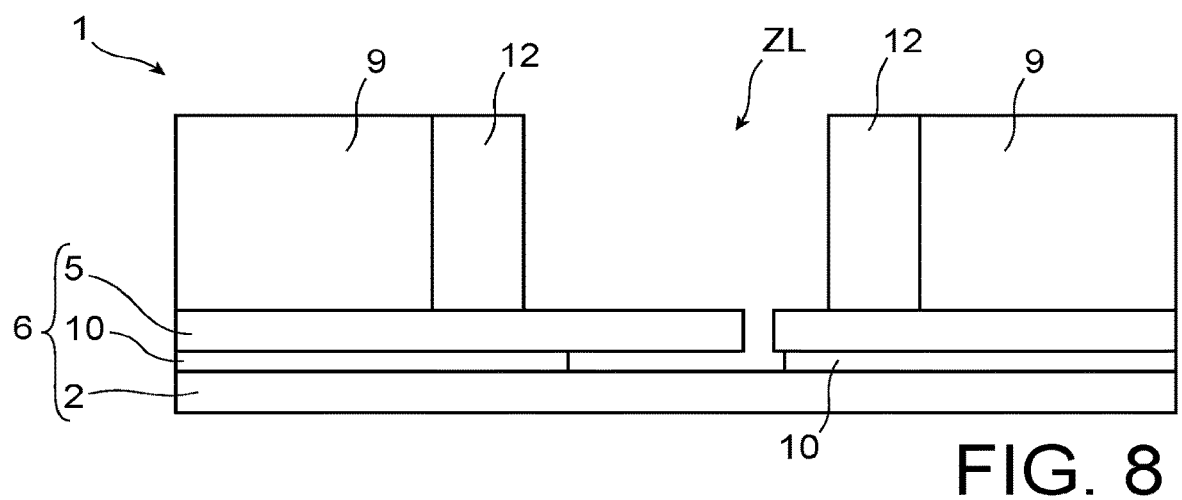

The technical film 5 may further be transferred onto the decorative film 2 by means of an adhesive layer 10, as may be seen in FIG. 8. This adhesive layer 10 is advantageously configured to be able to withstand thermal and mechanical stresses during the step of injection of the plastic material 9. It may for example be an adhesive transfer tape of 467 MP type of the 3M Company. Thus, the adhesive layer 10 may be laminated on the technical film 5. The adhesive layer 10 may for example have a thickness of the order of 50 µm. In this case also, the bonding of the technical film 5 on the decorative film 2 may be carried out before a step of thermoforming the decorative film 2, or instead after a step of thermoforming.

Thus, the assembly of the decorative film 2 and the technical film 5 makes it possible to obtain an interface film 6, as represented in FIG. 1.

This interface film 6 is next positioned in an injection mould 7. This injection mould 7 includes an upper portion 7a called counter mould and a lower portion 7b called matrix, the latter constituting the moveable portion of the mould 7. This injection mould 7 is preferentially made of tempered steel.

The interface film 6 is placed in contact with the upper portion 7a. It is maintained by means of suction lines.

The lower portion 7b of the injection mould 7 includes a moveable support pad 8 which is capable of coming into contact with the interface film 6 at the level of the layer of haptic actuators 3 such that a thickness E is left free between the interface film 6 and the lower portion 7b of the mould 7 outside of the support pad 8.

The support pad 8 is preferentially metal. It may be in the form of a cylinder of diameter comprised between 5 and 40 mm, for example. Thus, it may enable the formation of a free zone ZL, without plastic material 9 in the plastic part 1, of circular shape and having a diameter D comprised between 5 and 40 mm, as may be seen in FIG. 3 for example. Obviously, the support pad 8 may have in section a shape other than circular, for example polygonal, for example rectangular or square.

The support pad 8 is thereby situated opposite the haptic actuators and is going to prevent the injected plastic material 9 flowing at the level of the haptic actuators.

Advantageously, the support pad 8 is mounted on an elastic return member, notably a spring 11, within the lower portion 7b of the injection mould 7. In this way, this makes it possible to obtain a good leak tightness and thus to avoid the injected plastic material 9 infiltrating along the free surface of the actuators, while avoiding punching the interface film 6 and cutting the contacts.

The mould 7 is then closed, the closing force being linked to the projected surface of the part and to the injected material. Then, an injection of the plastic material 9 is made into the free thickness E on either side of the support pad 8.

The injected plastic material 9 is preferentially polycarbonate. It may for example be high fluidity polycarbonate, for example of Makrolon® 2207 or Makrolon® 2407 type of the Plastics Covestro Company.

The injection temperature may be comprised between 260 and 300° C. The injection pressure is linked to the part but may generally speaking be comprised between 300 and 600 bars. The maintaining pressure is linked to the part but may generally speaking be comprised between 800 and 1000 bars. The temperature of the injection mould 7 may be comprised between 60 and 80° C.

Next, the injection mould 7 is opened and the plastic part 1 is ejected.

A plastic part 1 is thereby obtained, for example of the type of that illustrated in FIG. 2. The zone ZL behind the haptic actuators is thus left free by means of a modification of the tooling used during the plastic injection in such a way that the injected plastic material does not come to the level of the actuators.

Figure 3:
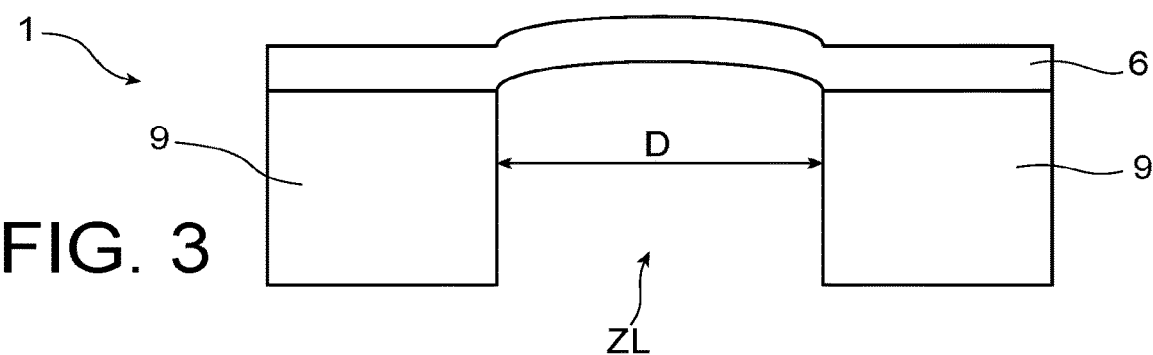
FIG. 3 illustrates, partially in section, another example of plastic part obtained by the method illustrated in FIG. 1 with the presence of a blister.

Thus, the invention makes it possible to integrate haptic actuators on a flexible plastic film provided with a decorative film, while conserving the haptic properties, namely the vibration of the surface during an action of the user, and the aesthetic constraints imposed by the manufacturer, namely through the integration of a decorative film and the absence of deformation linked to the shrinkage observed during cooling of the plastic part 1 and the over-moulded film, as explained hereafter with reference to FIG. 3.

Indeed, at the end of the injection step, following the shrinkage of the injected plastic material 9, it is possible that a slight blister may appear on the surface of the plastic part 1, as may be seen in FIG. 3.

For certain items of equipment, this blister is not acceptable from an aesthetic viewpoint. Its presence to the touch must not be felt. The sensitivity threshold to a mechanical stimulation of the skin corresponds to an indentation of 5 µm and it is necessary to be able to ensure that the maximum deformation linked to the shrinkage of the injected plastic material 9 is below this value.

Figure 4:
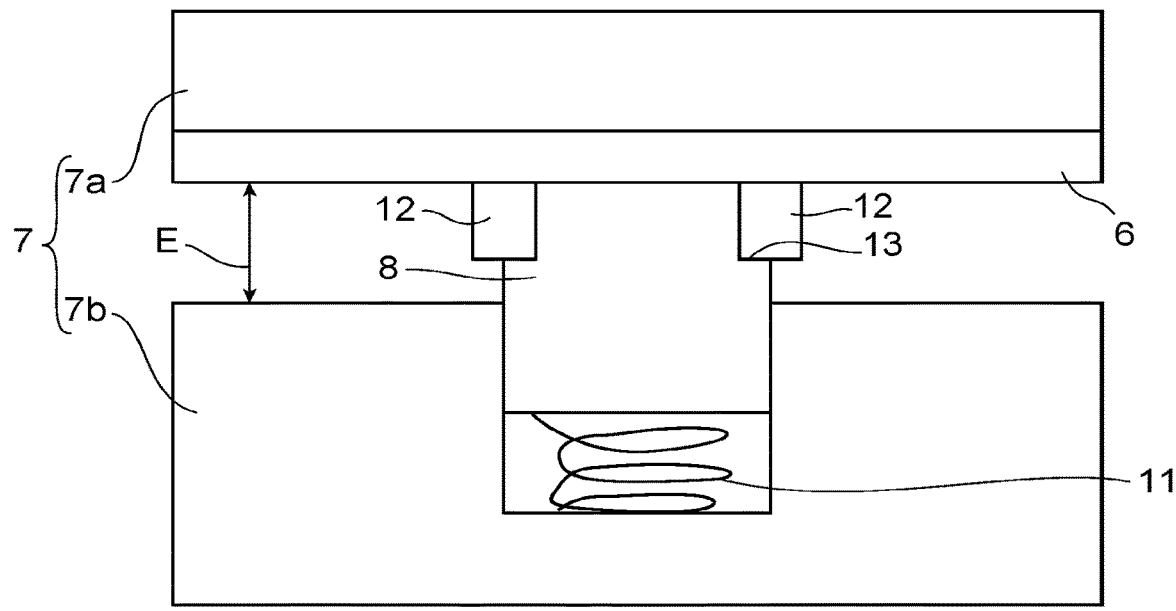
FIG. 4 illustrates partially another exemplary embodiment of a method for manufacturing a plastic part forming a human-machine control interface in accordance with the invention.
Figure 5:
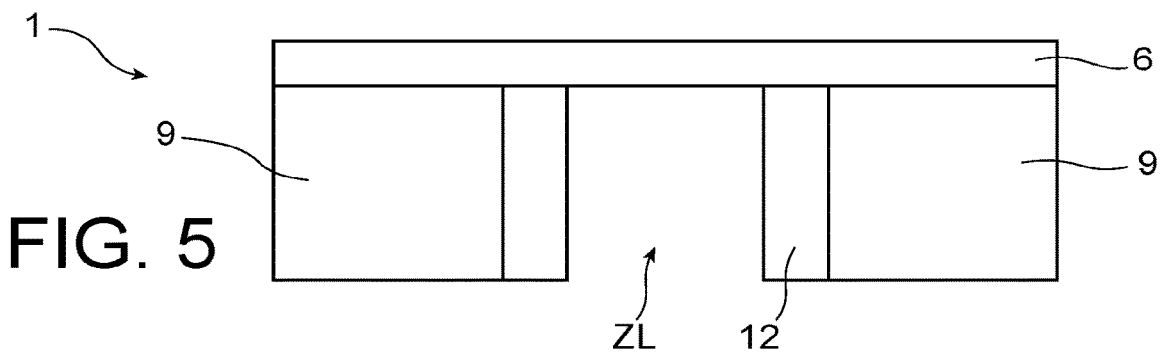
FIGS. 5 to 8 illustrate, partially in section, alternative embodiments of plastic parts obtained by a manufacturing method in accordance with the invention similar to that illustrated by FIG. 4.

Thus, to avoid this deformation, before the step of injection of the plastic material 9, the method may comprise the step of positioning an anti-deformation part 12 in contact with the interface film 6 in superposition with the support pad 8, intended to be situated in the free zone ZL of the plastic part 1 formed by the support pad 8, as illustrated by FIG. 4.

This anti-deformation part 12 is going to prevent the shrinkage of the injected material and eliminate the appearance of any blister.

The anti-deformation part is thereby positioned in the counter mould 7a, as illustrated in FIG. 4, and the support pad 8 may comprise a machining 13 to be able to receive it.

The anti-deformation part 12 may be an annular part, for example a washer or a cup. It is advantageously metal. It may further be a plastic part injected into a thermally stable material, for example glass fibre filled polyamide, glass beads, polybutylene terephthalate (PBT), poly ether ether ketone (PEEK), among others, which is not going to deform during the cooling of the part 1.

In the case of a hollow annular anti-deformation part 12, the hollow space of the part may be filled with a hardening material, for example during a new step of over-moulding or by carrying out a deposition of a material capable of hardening, for example silicone or polyurethane. The anti-deformation part 12 may be smooth or have splines or a groove so as to maintain it in place during shrinkage.

The addition of such a thermally stable part 12 in the free zone ZL where the haptic actuators are located makes it possible to avoid the appearance of any blister likely to form above the free zone ZL during the cooling of the part 1, after injection. FIGS. 5 to 8 thus illustrate examples of plastic parts 1 obtained by the addition of such an anti-deformation part 12.

In certain cases, it is to be feared that the free zone ZL can be pushed in and/or torn during incorrect use. It is then useful to added a mechanically robust element behind the haptic actuators while leaving a free surface so that they can emit a perceptible vibration.

Figure 6:
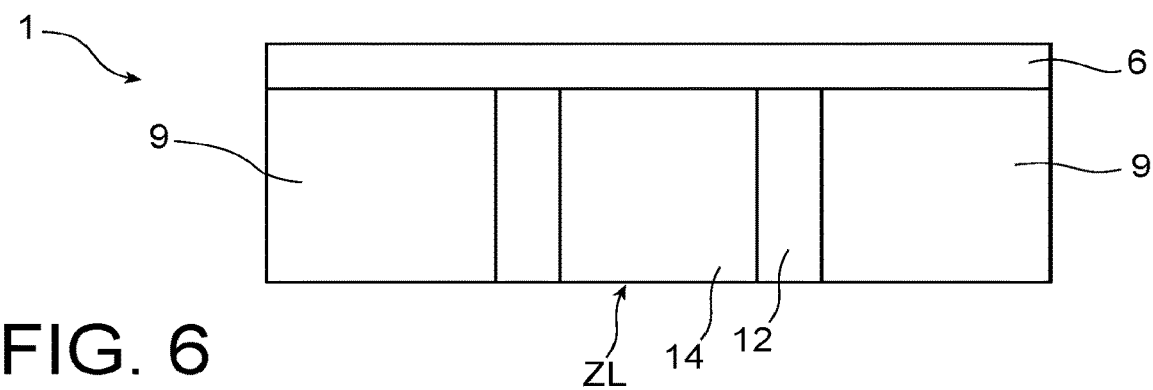

Thus, as illustrated by FIG. 6, at the end of the step of ejection of the plastic part 1, the method may comprise the step consisting in filling the free zone ZL with a flexible material 14, notably a rubbery material, for example polydimethylsiloxane (PDMS), having a low Young's modulus less than 1 GPa, notably less than 100 MPa.

Figure 7:
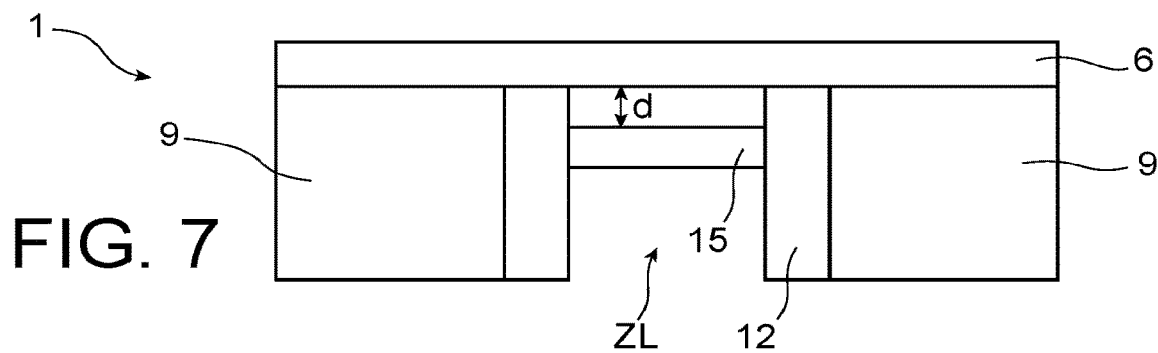

It is further possible, as illustrated by FIG. 7, to provide, at the end of the step of ejection of the plastic part 1, a step consisting in inserting into the free zone ZL a mechanically robust wall 15 at a distance from the interface film 6. This wall 15 may be solid or perforated, and may be made of metal or plastic. The distance d separating the interface film 6 and the mechanically robust wall 15 is preferentially comprised between 0.3 and 1 mm.

Advantageously, this wall 15 serves as bottom and makes it possible to avoid indentation during the use of the haptic actuators. The finger of the user will be blocked by this wall 15 avoiding the deterioration of the decorative film 2.

Figure 9:
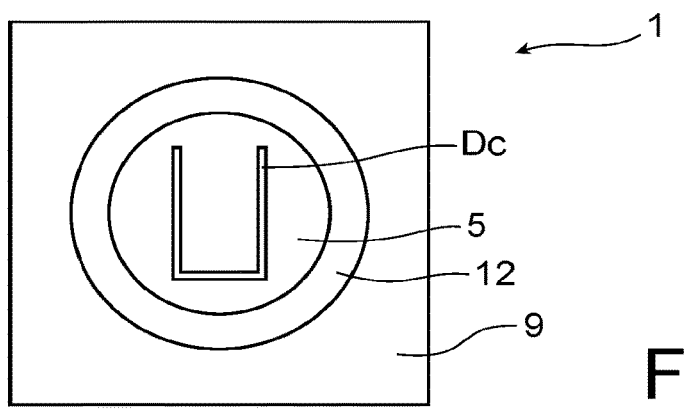
FIG. 9 is a partial top view of FIG. 8.

Furthermore, as FIGS. 8 and 9 illustrate, the method may also comprise the cutting Dc of the layer of haptic actuators 3 and an optional adhesive layer 10 between the layer of haptic actuators 3 and the layer of capacitive sensors 4. This cutting may be a cutting by laser. Thus, the method may comprise the step consisting in inserting a ZIF (zero insertion force) type connector, at the level of the cutting of the layer of haptic actuators 3.

Obviously, the invention is not limited to the exemplary embodiments that have been described. Various modifications may be made thereto by those skilled in the art.

In particular, it is to be noted that the haptic actuators of the layer of haptic actuators 3 may be configured to operate as haptic sensors such that the interface formed by the decorative film 2 comprises one or more pressure sensitive buttons. In this case, when the user presses on a pressure sensitive button of the decorative film 2, the fact that there is a free zone ZL behind the haptic sensors allows them to deform and to generate electric charges that can be measured by a reading electronic.

The invention claimed is:

1. A method for manufacturing a plastic part forming a human-machine control interface, comprising:
   formation of a decorative film as the control interface,
   formation of a technical film including a layer of haptic actuators and a layer of capacitive sensors,
   assembly of the decorative film and the technical film to form an interface film,
   positioning of the interface film in an injection mould, including an upper portion with which the interface film is maintained in contact by suction and a lower portion including a moveable support pad configured to be in contact with the interface film at a level of the layer of haptic actuators such that a thickness is left free between the interface film and the lower portion of the injection mould outside of the support pad,
   injection of a plastic material into the free thickness on either side of the support pad while the movable support pad is in contact with the interface film,
   opening of the injection mould and ejection of the plastic part formed.

2. The method according to claim 1, in which the decorative film has a thickness comprised between 100 μm and 2 mm.

3. The method according to claim 1, further comprising thermoforming the decorative film.

4. The method according to claim 1, in which the decorative film and the technical film are assembled together by means of an adhesive layer.

5. The method according to claim 1, in which the support pad is configured to form a free zone, without plastic material in the plastic part, of circular shape and having a diameter between 5 and 40 mm.

6. The method according to claim 1, in which the support pad is mounted on an elastic return member within the lower portion of the injection mould.

7. The method according to claim 1, in which the injection mould is made of tempered steel.

8. The method according to claim 5, in which, before injection of the plastic material, the method comprises positioning an anti-deformation part in contact with the interface film in superposition with the support pad, said anti-deformation part situated in the free zone of the plastic part formed by the support pad.

9. The method according to claim 8, in which the support pad includes a region of reduced outer diameter to receive at least a portion of said anti-deformation part within the region.

10. The method according to claim 5, in which, at the end of ejection of the plastic part, the method comprises filling the free zone, without plastic material and formed by the support pad, with a flexible material, having a Young's modulus less than 1 GPa.

11. The method according to claim 5, in which, at the end of ejection of the plastic part, the method comprises inserting into the free zone, without plastic material and formed by the support pad, a mechanically robust wall at a distance from the interface film.

12. The method according to claim 11, in which the distance separating the interface film and the mechanically robust wall is comprised between 0.3 and 1 mm.

13. The method according to claim 1, in which the haptic actuators of the layer of haptic actuators are configured to operate as haptic sensors such that the interface formed by the decorative film comprises one or more pressure sensitive buttons.

14. The method according to claim 1, further comprising cutting of the layer of haptic actuators; and
   laminating an adhesive layer between the layer of haptic actuators and the layer of capacitive sensors.

15. The method according to claim 14, further comprising inserting a ZIF (zero insertion force) type connector, at a position of the cutting of the layer of haptic actuators.

* * * * *